United States Patent

[11] 3,565,090

[72] Inventor William V. Miller
Los Angeles, Calif.
[21] Appl. No. 797,939
[22] Filed Feb. 10, 1969
[45] Patented Feb. 23, 1971
[73] Assignee TRW Inc.
Redondo Beach, Calif.

[54] ANALOG ELECTRICAL-TO-FLUIDIC TRANSDUCER
1 Claim, 3 Drawing Figs.

[52] U.S. Cl. .......... 137/81.5
[51] Int. Cl. .......... F15c 1/14, F15c 3/00
[50] Field of Search .......... 137/81.5

[56] References Cited

UNITED STATES PATENTS 3,144,037 8/1964 Cargill et al. .......... 137/81.5
3,292,648 12/1966 Colston .......... 137/81.5
3,390,692 7/1968 Hastic et al. .......... 137/81.5
3,412,745 11/1968 Kelley .......... 137/81.5

*Primary Examiner*—William R. Cline
*Attorneys*—Daniel T. Anderson, Gerald Singer and Alfons Valukonis

ABSTRACT: A pair of bender type piezoelectric crystal drivers, one controlled by a fixed frequency oscillator and the other driven by a continuously variable controlled oscillator, are used to impress a modulated carrier on a fluid. The modulated carrier is represented as pressure variations on the fluid. Conventional fluidic techniques amplify and demodulate and frequency detect the modulating analogue signal and generate a DC output in which the amplitude or pressure e varies proportionately as the analogue modulation varies.

William V. Miller
INVENTOR.

BY [signature]

AGENT

ANALOG ELECTRICAL-TO-FLUIDIC TRANSDUCER

SUMMARY

This invention eliminates the need for mechanical devices and discloses a system for applying an analogue input signal in the form of a mechanical input or an electrical input without the need of mechanical moving parts as is presently required in the art today. The benefits of this invention are achieved by using a proportional fluidic amplifier and at least one piezoelectric bender crystal controlled by a voltage controlled oscillator. The crystal driver is coupled to the fluid located within the proportional fluidic amplifier and imparts a modulated carrier detected as variations of the fluid. The crystal driver is preferably driven by a voltage controlled oscillator that may be modulated by either an analogue mechanical modulating input or an analogue electrical modulating input. Conventional fluidic techniques are used to amplify and frequency detect the modulating signal which is represented as a substantially constant pressure output in which the amplitude of the pressure varies as a modulating means varies.

DESCRIPTION OF THE PREFERRED EMBODIMENTS

Figure 1:
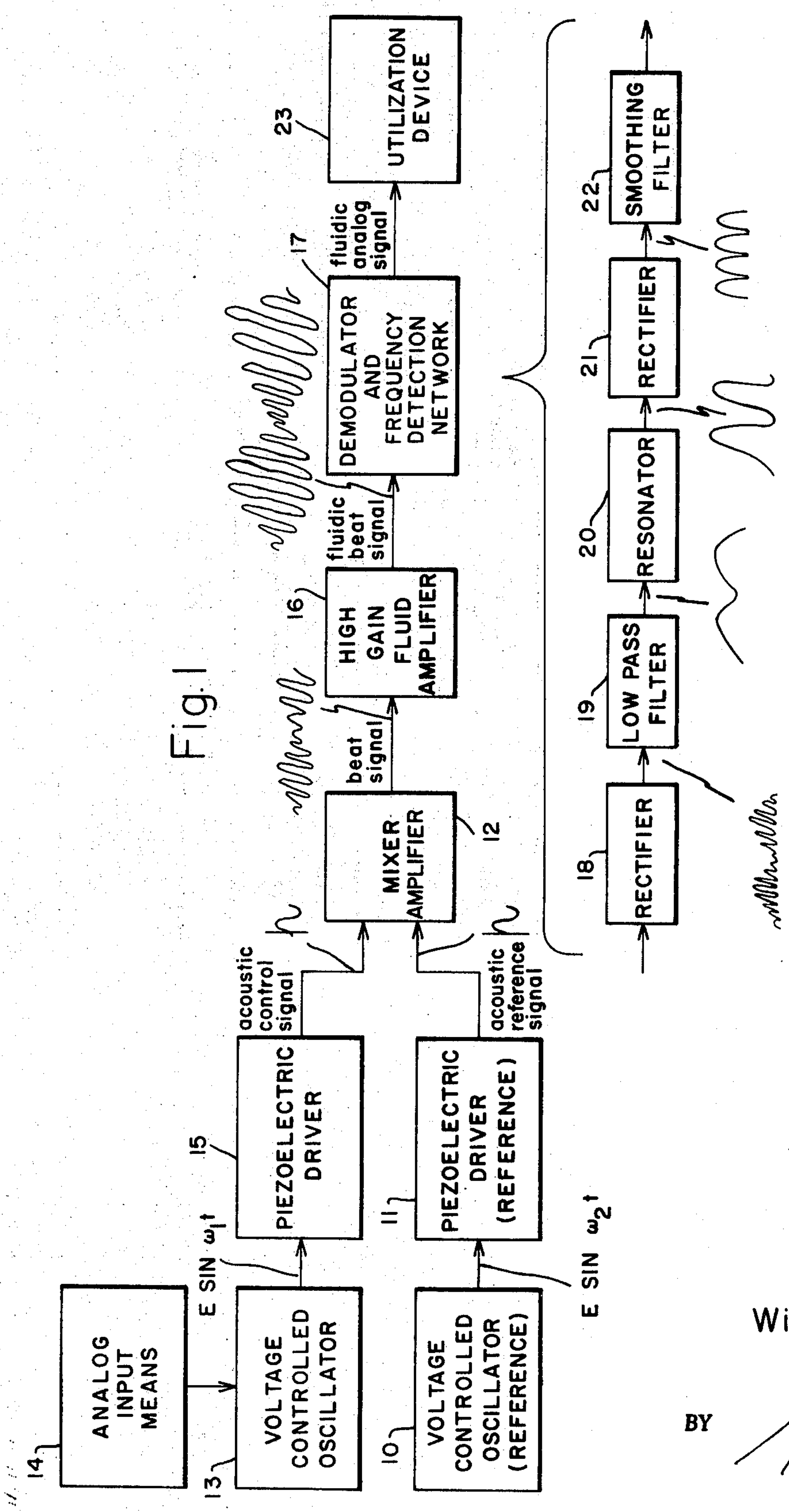
FIG. 1 illustrates a block diagram of a preferred embodiment of this invention.
Figure 3:
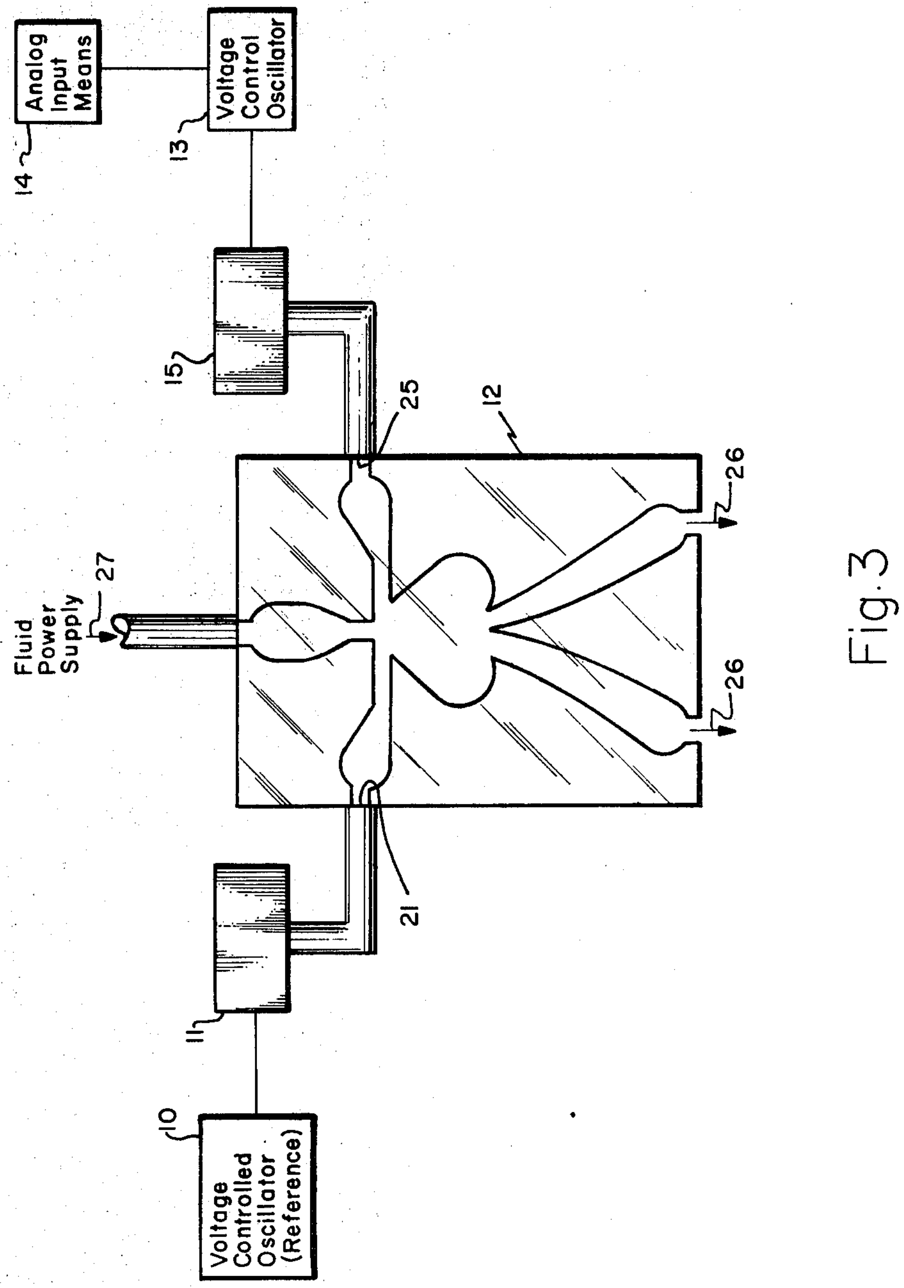
FIG. 3 illustrates a schematic diagram of the preferred embodiment of the invention shown in FIG. 1.

The system illustrated in FIGS. 1 and 3 combines the operating characteristics of a piezoelectric bender element with the advantages of carrier circuit techniques in order to achieve a practical electrical-to-fluidic interface. The basic approach utilizes two such interfaces, or drivers, operating into opposing control ports of a fluid mixer amplifier so that frequency beating is achieved at the output of the fluid mixer amplifier when the information contained in the driver signals is in the form of frequency. The difference in driver frequencies is proportional to the input DC electrical signal. After additional amplification, a fluidic frequency discriminator network is utilized to interpret the beat frequency and translate it into a DC fluidic signal. Control of the piezoelectric drivers peizoelectric provided by DC voltage controlled electronic oscillators. The carrier circuit techniques represent a number of fairly sophisticated network functions that include frequency beating, rectification, filtering and frequency discrimination. The use of these techniques in fluidic systems is well known in the art today and therefore considered state-of-the-art. See U.S. Pat. No. 3,292,648 to J. R. Colston for examples of such techniques.

Referring to FIGS. 1 and 3, a reference voltage controlled oscillator 10 generates an AC signal that is used to drive a piezoelectric crystal driver 11. The piezoelectric crystal 11 converts the input signal from oscillator 10 to an acoustic reference output signal that is used to modulate a fluid in a mixer amplifier 12. The mixer 12 is preferably a proportional fluid amplifier having conventional inlet ports 24 and 25, outlet ports 26 and a source of fluid 27. In the preferred embodiment, a second voltage controlled oscillator 13 having a frequency that is preferably harmonic of oscillator 10 is modulated by an analogue input means 14. The analogue input means may either be a variable electrical signal generated by external apparatus or may include a mechanical analogue input that is converted to an electrical varying signal for controlling the oscillator 13. In the conventional apparatus, the analogue input means 14 may receive the feedback signal from the external apparatus being controlled by the transducer system illustrated in FIGS. 1 and 3. The varying carrier signal generated by the voltage controlled oscillator 13 drives a piezoelectric crystal driver 15 that is structurally similar in operation to driver 11, and in turn generates an acoustic controlled signal that is coupled to the mixer amplifier 12 through inlet ports 25. The fluid is modulated by both piezoelectric crystal drivers 11 and 15 within the mixer amplifier 12 without mechanically controlling the fluid or using mechanical flapper valves of any type.

As shown in FIG. 3, piezoelectric crystal driver 11 is driven by a reference oscillator 10, thus furnishing a fixed frequency pneumatic or hydraulic pressure signal to control port 24 of mixer amplifier 12. The opposite control port 25 is in series with a second piezoelectric crystal driver 15 which is driven at a frequency proportional to the actual (analogue) electrical control signal by oscillator 13. If the frequency of the reference oscillator 10 is fixed at a value which represents the nominal value of the opposing control oscillator frequency 13, then the two resulting fluid frequency signals fed to opposing control ports 24 and 25 of mixer amplifier 12 will result in frequency beating.

For maximum power transmission, frequency of oscillator 10 should be a resonant frequency of piezoelectric crystal driver 11. The output differential pressure at outlet ports 26 from mixer amplifier 12 will then be a continuous function of the difference between the control and reference frequencies (the beat frequency signal). As such, the device operates similarly to a modulator in electrical AC carrier systems, and a fluidic frequency discrimination network can be used to obtain a fluidic DC signal proportional to the beat frequency.

The output of the mixer amplifier 12 at outlet ports 26 can be shown to be a low level beat signal that is fed to a high gain fluid amplifier 16 which amplifies the signal into a fluidic beat signal of greater amplitude that is eventually detected and demodulated in a modulation and frequency detecting network 17. As is conventional in detecting modulated signals on carriers, the modulator and frequency detection network 17 comprises a fluidic rectifier 18, a fluidic low pass filter 19, a fluidic resonator 20, a fluidic rectifier 21 and a fluidic smoothing filter 22, all connected in series for generating an output fluidic analogue signal in which the amplitude of the pressure varies proportionally to the analogue input means 14. The output of the demodulator and frequency detection network 17 may therefore be used to control a fluid power utilization device 23, the output of which may generate a feedback signal connected to the analogue input means depending on the actual application of system being controlled. Fluidic elements such as rectifiers, resonators and filters are well known in the art. See, for example, U.S. Pat. No. 3,292,648 to J. R. Colston.

Figure 2:
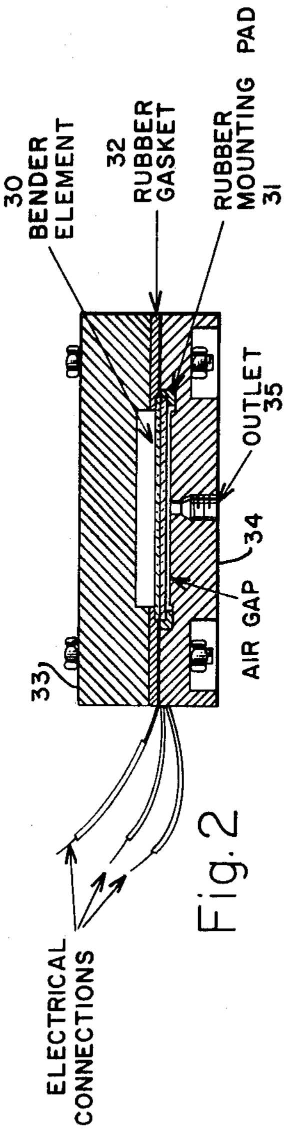
FIG. 2 illustrates a cross section of a preferred piezoelectric driver illustrating a bender element.

Referring now to FIG. 2, there is shown a piezoelectric crystal driver illustrated as either items 11 and 15 in FIGS. 1 and 3. The implementation illustrated in FIG. 2 provides for the transformation of an electrical signal into a fluidic (acoustic signal). The preferred technique is to provide a means of coupling between the crystal and the air trapped in the adjacent gap between the crystal and the housing. This approach is very similar to the operation of a typical loudspeaker, and when used in this fashion, generates a purely acoustic signal. In constructing the piezoelectric crystal drivers elements 11 and 15, the bender Bimorph crystal element was used and was approximately 1 inch wide by 2 inches long and approximately 0.100 inch thick. The crystal bender element 30 is mounted on a rubber mounting pad 31 on one side and rubber gasket 32 on the other side of the crystal 30. The complete assembly is housed between housing 33 and housing 34. In the preferred embodiment, a centrally located outlet 35 is communicated with the mixer amplifier 12 illustrated in FIG. 3, which thereby allows the acoustical vibrations generated in the bender element 30 to be communicated with the fluid.

An alternate approach is possible in certain applications when the wider control range that can be obtained by implementing the electrical-to-fluidic transducer employing beat frequency techniques is not required. The mechanization schematized in FIG. 1 is therefore modified by eliminating the voltage control oscillator 10 and the driver 11. In this approach the signal information is contained only in the frequency provided by the voltage controlled oscillator. It is then only necessary to convert this frequency to an analogue DC signal.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein, except as defined by the appended claims.

I claim:

1. A fluidic device comprising:

a proportional fluidic amplifier including opposed inlets, an outlet and a source of fluid power;

first piezoelectric crystal means applying a first fluid signal to one of said opposed inlets;

a first voltage controlled oscillator driving said first piezoelectric crystal means;

second piezoelectric crystal means applying a second fluid signal to the other of said opposed inlets;

a second voltage controlled oscillator driving said second piezoelectric crystal means;

said first and second piezoelectric crystal means being identical and each comprising; a substrate having an opening therein, and a piezoelectric crystal bender element mounted across said opening, so that said piezoelectric crystal bender element generates a compressional wave fluid signal at said opening; and means coupled to said outlet for detecting and demodulating the fluid signal exiting therefrom to produce an analogue fluidic signal.

UNITED STATES PATENT OFFICE

CERTIFICATE OF CORRECTION

Patent No. 3,565,090 February 23,

William V. Miller

It is certified that error appears in the above identifie patent and that said Letters Patent are hereby corrected as shown below:

On the cover sheet, line 8, cancel "e"; same cover sheet lines 7 and 9, Column 1, lines 64, 66 and 69, Column 2, lines 37, 38 and 42, Column 3, line 2, and Column 4, line 15, "analogue", each occurrence, should read -- analog --. Columr line 1, after "ANALOG ELECTRICAL-TO-FLUIDIC TRANSDUCER" begir with "SUMMARY" cancel all to and including "means varies." ir 20, same column 1 and insert instead the following:

BACKGROUND OF THE INVENTION

This invention is concerned primarily with the art of transforming an analog signal defined as a continuously vari input signal into a fluidic DC output in which the amplitude or pressure of the output is continuously proportional to th variations of the input analog signal.

The area of interest of this invention should be immedia distinguished from the area of fluidic digital control in wh discrete input signals cause discrete fluidic output signals This invention is concerned primarily with analog input sign that provide a continuously variable output signal without using mechanical proportional devices as are common in the a today. The biggest drawback in the analog fluidic field is present need for mechanical flapper valves that are mechanic caused to move between opposing orifices so as to vary the pressure of the output of each orifice. These devices vary flapper valve in an analog fashion thereby causing the resul pressure changes between the opposing orifices to vary in an analog fashion. The use of mechanical moving parts in a flu amplifier has limited the development of the art to a labora curiosity.

SUMMARY

This invention eliminates the need for mechanical devic and discloses a system for applying an analog input signal i the form of a mechanical input or an electrical input withou need of mechanical moving parts as is presently required in art today. The benefits of this invention are achieved by u a proportional fluidic amplifier and at least one piezoelect bender crystal controlled by a voltage controlled oscillator The crystal driver is coupled to the fluid located within the proportional fluidic amplifier and imparts a modulated carrier detected as pressure variations of the fluid. The crystal driver is preferably driven by a voltage controlled oscillator that may be modulated by either an analog mechanical modulating input or an analog electrical modulating input. Conventional fluidic techniques are used to amplify and frequency detect the modulating signal which is represented as a substantially constant pressure output in which the amplitude of the pressure varies as a modulating means varies.

same column 1, line 36, after "practical" insert -- analog --; line 46, "peizoelectric" should read -- is --.

Signed and sealed this 7th day of September 1971.

(SEAL)
Attest:

EDWARD M.FLETCHER,JR.
Attesting Officer

ROBERT GOTTSCHALK
Acting Commissioner of Pa